United States Patent [19]

Heuermann et al.

[11] Patent Number: 5,608,330
[45] Date of Patent: Mar. 4, 1997

[54] METHOD FOR CALIBRATING A NETWORK ANALYZER ACCORDING TO THE SEVEN-TERM PRINCIPLE

[75] Inventors: Holger Heuermann, Tittmoning; Burkhard Schiek, Bochum, both of Germany

[73] Assignee: Rohde & Schwarz GmbH & Co. KG, Munich, Germany

[21] Appl. No.: 539,087

[22] Filed: Oct. 4, 1995

[30] Foreign Application Priority Data

Oct. 5, 1994 [DE] Germany ............... 44 35 559.9

[51] Int. Cl.⁶ ............... G01R 27/28; G01R 35/00
[52] U.S. Cl. ............... 324/601; 324/638; 364/571.01; 364/571.02
[58] Field of Search ............... 324/601, 637, 324/638, 641, 642, 646; 364/571.01, 571.02, 571.08

[56] References Cited

U.S. PATENT DOCUMENTS

| | | | |
|---|---|---|---|
| 4,982,164 | 1/1991 | Schiek et al. | 324/638 |
| 5,097,215 | 3/1992 | Eul et al. | 324/601 |
| 5,313,166 | 5/1994 | Eul et al. | 324/601 |
| 5,440,236 | 8/1995 | Schiek et al. | 324/601 |
| 5,442,296 | 8/1995 | Schiek et al. | 324/601 |

Primary Examiner—Kenneth A. Wieder
Assistant Examiner—Diep Do
Attorney, Agent, or Firm—Hill, Steadman & Simpson

[57] ABSTRACT

A method calibrates a network analyzer having two test ports and at least four measuring locations by successive measurement of the transmission and reflection parameters at three calibration standards successively connected in arbitrary sequence between the two test ports according to the seven-term principle. A first calibration measurement is implemented at an electrical line whose characteristic impedance is known and whose electrical propagation constant may be unknown and complex. Second and third calibration measurements are then respectively implemented at a two-port that is connected between the test ports and is constructed of concentrated components. The electrical propagation constant of the line and correction values that are taken into consideration in following object measurements are calculated from these measured values.

10 Claims, 1 Drawing Sheet

METHOD FOR CALIBRATING A NETWORK ANALYZER ACCORDING TO THE SEVEN-TERM PRINCIPLE

The present invention is directed to a method for calibrating a network analyzer.

A prior art method is disclosed in U.S. Pat. No. 4,982, 164. This so-called seven-term method has the advantage that only three calibration standards are required calibration standards. According to this prior art method, however, a two-port for which all complex scatter parameters are known is assumed for the first calibration measurement. This is most simply achieved for object measurements in the coaxial waveguide field by a direct connection of the two test ports (Through measurement). A reflection-free wave sink (Match), for example, is successively connected to the two test ports for the second calibration measurement. A one-port having known reflection (Reflection), for example, is successively connected to the two test ports for the third calibration measurement (called TMR calibration method). The T-standard can usually no longer be realized for measurements on planar microwave circuits or semiconductor substrates (on-wafer measurements). Instead, a known line (Line) is used as a first calibration standard for the first measurement (LRM calibration, also described, for example, in "achieving greater on-wafer S-parameter accuracy with the LRM calibration technique", by A. Davidson, E. Strid and K. Jones, Cascade-Microtech, Product Note). This known LRM calibration method used for on-wafer measurements also assumes that all scatter parameters of the electrical line used for the first calibration measurement are known, that is, both the characteristic impedance as well as the complex propagation constant or, respectively, the product of the complex propagation constant with the mechanical length of the line. The first calibration standard for this known method is therefore relatively complicated and expensive.

SUMMARY OF THE INVENTION

It is an object of the present invention to provide a calibration method according to the seven-term principle wherein three simple and economical calibration standards are used.

In general terms the present invention is a method for calibrating a network analyzer having two test ports and at least four measuring locations by successive measurement of the transmission and reflection parameters at three calibration standards successively connected in arbitrary sequence between the two test ports, according to a seven-term principle. A first calibration measurement is implemented at an electrical line and second and third calibration measurements are respectively implemented at a two port connected between the test ports and constructed of concentrated components. Correction values that are taken into consideration in following object measurements are calculated from these measured values. A line is employed for the first calibration measurement whose characteristic impedance is known and whose electrical propagation constant may be unknown and complex. The electrical propagation constant of this line is subsequently calculated from the measured values measured at all three calibration standards.

Advantageous developments of the present invention are as follows.

In this embodiment a line constructed in planar stripline technology is employed for the first calibration measurement.

A two-port is used for the second calibration measurement, that is composed of a series-connected component with known impedance and a concentrated component of unknown impedance connected to ground. The third calibration measurement is implemented at this same two-port of the second calibration measurement that is turned with respect to the terminals at the two test ports.

The second calibration measurement is implemented at a two-port that is composed only of a single, concentrated, series-connected component with known impedance. The third calibration measurement is implemented at a reflection-symmetrical two-port whose impedance may be unknown. The second calibration measurement is implemented at a two-port, for which only the resistance of the series-connected component is known and the reactance is potentially unknown. Preceding the third calibration measurement at the refection-symmetrical two-port with unknown impedance, a further calibration measurement is implemented at a two-port that is again composed only of a single, concentrated, series-connected component with known resistance but unknown reactance and whose value of resistance differs from that of the calibration standard of the second calibration measurement. The second calibration measurement is implemented with a one-port whose characteristic impedance is known and that is successively connected to the two test ports. The third calibration measurement is implemented at a further one-port that has known reflection and is successively connected to the two test ports.

The invention is based on the perception that only the characteristic impedance of the electrical line used for the first calibration measurement must be known, whereas the electrical propagation constant may be unknown and complex since this can be subsequently calculated in a simple way from all calibration measurements, (set forth in greater detail below, see equation 16). The first calibration standard can thus be very simply and economically realized. Such a short electrical line, for which only the characteristic impedance but not the propagation constant is known, can, above all else, also be very simply and economically constructed in planar stripline technology. Such a calibration standard is thus especially suited for the calibration of following object measurements at planar microwave circuits (on-wafer measurements). The calibration standards for the second and third calibration measurement can likewise be very simply and economically realized.

In what is referred to as the LZY method, the same calibration standard is used for the second and third calibration measurement, and is composed of a known series impedance and of an unknown impedance to ground. Series impedances can be fabricated with great precision and low parasitic parts in planar microwave circuits, whereas the fabrication of precise impedances to ground is not possible, particularly on semiconductor substrates. This ZY calibration standard also offers the additional advantage that the input resistance of the one port can be designed to the reference resistance (generally 50 ohms), which guarantees a test sensitivity for this important impedance value. For self-monitoring of the calibration process, the value of the Y-component can also be subsequently calculated as warranted in this LZY calibration measurement.

Also, in the LZN method, a two-port that is composed only of a series impedance is used for the second calibration measurement. Such a calibration standard can be even more simply and economically constructed. Since the impedance to ground is eliminated, this Z standard has an extremely uniform behavior from the lowest up to extremely high frequencies. The N-standard that is also additionally employed supplies additional self-calibration values for the transmission behavior, so that this LZN method offers the possibility of assuring the test capability both for relaxation measurements as well as for transmission measurements via prior information of the N-standard.

Further, in the LZZN method, a total of four calibration measurements is in fact required for identifying the seven error terms. However, only the real part of the impedance value of the two Z-standards that in turn are only a series impedance must be known, so that only the ohmic part that can be easily identified at low frequencies need be known for an impedance that is composed, for example, of ohmic part and series inductance. The Z-standard can thus be even more simply and economically constructed.

Also, in the LMS or, respectively, LMO calibration method, known one-port calibration standards are used for the second and third calibration measurement, namely a one-port in the form of a wave sink M whose impedance corresponds to the reference resistance (characteristic impedance) and that is successively connected to the two test ports (what is referred to as double one-port calibration MM). A double one-port calibration having a short-circuit (SS) or an open circuit (OO) is again implemented for the third calibration measurement. Commercially obtainable calibration substrates can thus be used for the second and third calibration measurement.

According to the following description in conjunction with equation (16), the product of electrical propagation constant $\gamma$ and mechanical length l of the line employed is subsequently calculated. This product $\gamma l$ is required for the calibration according to the seven-term method. The mechanical length of the line can thus be unknown for the calibration. Since it is often only the complex propagation constant $\gamma$ that is of interest for the subsequent object measurement, for example for the setting of the reference level, $\gamma$ can also be directly calculated in a simple way from this calculated product $\gamma l$ given knowledge of the mechanical length of the line employed.

The inventive method is especially suited for on-wafer measurements wherein the two test ports and the test prods that are placed directly onto the interconnects of the semiconductor substrate are not too close to one another and which are therefore not yet coupled to one another.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
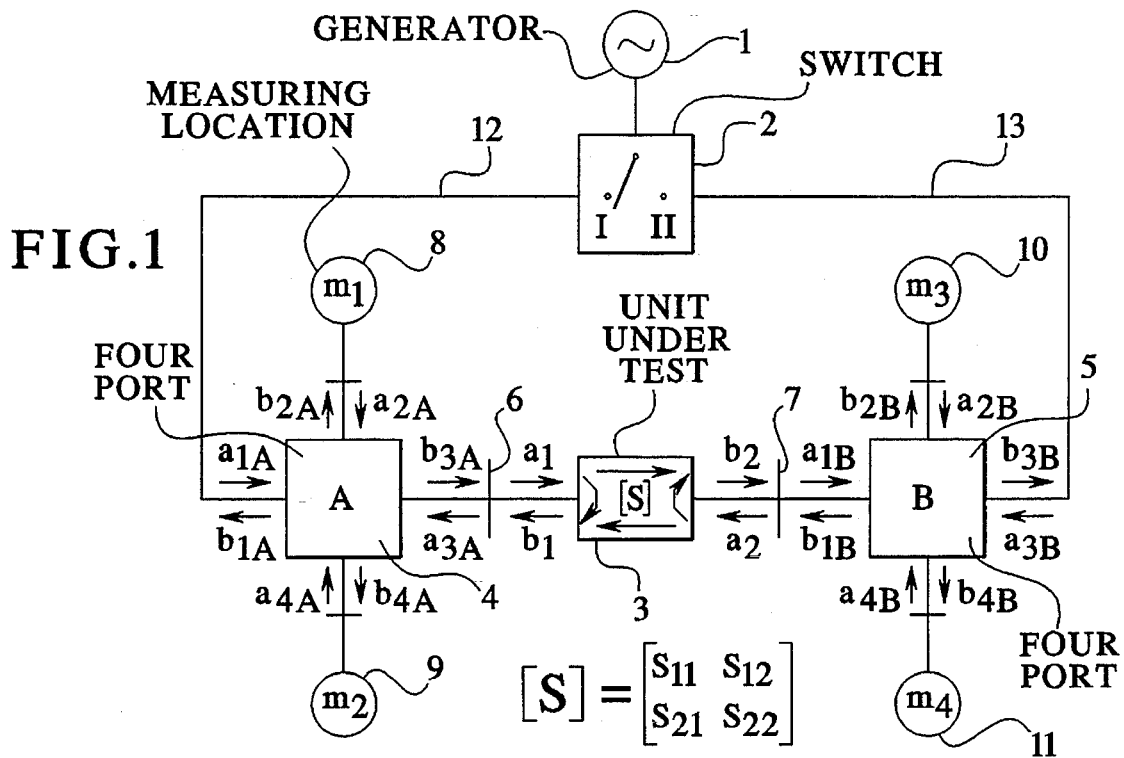
FIG. 1 is a schematic representation of a network analyzer using a calibration method according to the present invention.

FIG. 1 shows a highly simplified schematic circuit diagram of a network analyzer (NWA), whereby two measuring branches 12 and 13 are supplied from a high-frequency generator 1 via a switch-over means 2. These measuring branches 12, 13 discharge into two four-ports 4 and 5 which are required to have a linear transmission behavior and additionally require a decoupling of the measuring locations 8 and 9 or, respectively, 10 and 11. This is advantageous in the case of the scatter parameter measurements when these four-ports have matching on all sides and have the structure of a bridge, so that, for example, the measuring location 8 is a measure of the departing wave from the branch 12 and the measuring location 9 is a measure of the wave incoming from the unit 3 under test. If, however, impedance parameters are to be determined, such a low-impedance test set is not beneficial. Whatever the case may be, the use of a systematic error correction method allows a switch to be made to any linear form of description of networks insofar as the decoupling of the measuring locations and a linear transmission behavior of the four-ports 4 and 5 of the test set are assured.

The test ports 6 and 7 form the transition to the unit 3 under test and are also referred to as reference levels. According to what is referred to as the two-port error model (seven-term model), the noise quantities that thereby occur between the measuring points 8, 9, 10 and 11 and the unit 3 under test connected to the actual test ports 6 and 7.

These noise quantities are caused, for example, by the connecting lines leading to the unit under test, by mismatches and by undesired couplings, are thereby taken into consideration by what are referred to as error networks that are calculated by a calibration method and are taken into consideration as correction values in the actual measurement.

In the calibration measurement, the unit 3 under test is replaced by calibration standards. Four measured values for each switch position of the switch-over means 2 are then in turn acquired per standard.

For illustrating the following two-port self-calibration methods LZY, LZN, LZZN and LMS, the derivation of the imaging equation of the seven-term method is briefly described.

Fundamental Derivation for the Seven-Term Method

Herebelow, the mathematical derivation shall ensue in general form based on FIG. 1, so that both chain parameters as well as transmission parameters could be utilized. The electrical quantities at the measuring locations are treated like general measured values that can represent either currents and voltages or wave quantities.

The mathematical formulation of the two-port error model is arranged in chain or, respectively, transmission parameters:

$$\begin{pmatrix} m_1 \\ m_2 \end{pmatrix} = [A] \, [N] \, [B]^{-1} \begin{pmatrix} m_3 \\ m_4 \end{pmatrix} \quad (1)$$

The matrices [A] and [B] are error matrices that derive according to what is referred to as the four-port/two-port reduction. The physical quantities of the unit DUT (device under test) under test, which may be assumed to be described by the matrix [N], are transformed to the measuring locations via these matrices.

A meaningful equation is obtained for each switch position of the NWA illustrated in FIG. 1, which is also referred to as a double reflectometer, this equation, combined, yielding the following matrix equation.

$$\begin{pmatrix} m_1' & m_1'' \\ m_2' & m_2'' \end{pmatrix} = [A][N][B]^{-1} \begin{pmatrix} m_3' & m_3'' \\ m_4' & m_4'' \end{pmatrix} \quad (2)$$

By multiplication with the inverse of the right-hand measured value matrix, $$[M]=[A][N][B]^{-1}, \quad (3)$$

derives with the resultant measured value matrix:

$$[M] = \begin{pmatrix} m_1' & m_1'' \\ m_2' & m_2'' \end{pmatrix} \begin{pmatrix} m_3' & m_3'' \\ m_4' & m_4'' \end{pmatrix}^{-1} \quad (4)$$

The LZY Method

Figure 2:
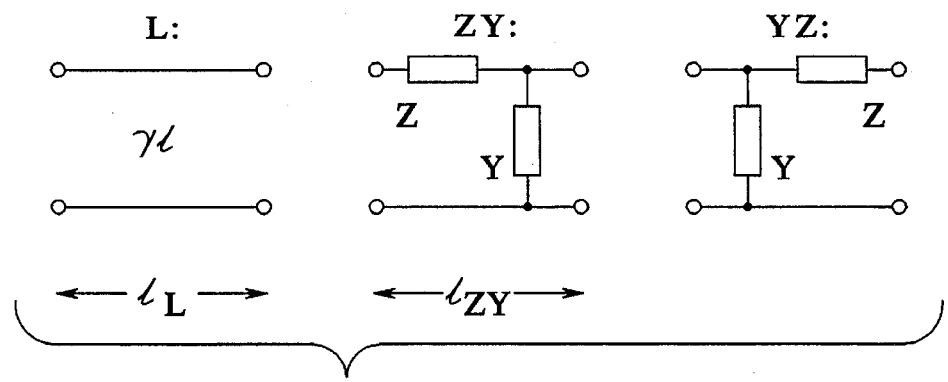
FIGS. 2 and 3 are schematic representations of standards for connection between the specified ports in FIG. 1 in a arbitrary sequence.

Obtained in the form of chain parameters for the three calibration objects of FIG. 2 with reference to equation (3) are:

$$L:[Ml]=[A][Kl][B]^{-1}, \quad (5)$$

$$ZY:[Mzy]=[A][Kzy][B]^{-1}, \quad (6)$$

$$YZ:[Myz]=[A][Kyz][B]^{-1}, \quad (7)$$

with the respective chain matrices $$[K1] = \begin{pmatrix} \cosh(\gamma l) & \sinh(\gamma l) \\ \sinh(\gamma l) & \cosh(\gamma l) \end{pmatrix}, \quad (8)$$

$$[Kyz] = \begin{pmatrix} 1+zy & z \\ y & 1 \end{pmatrix}, \quad (9)$$

$$[Kzy] = \begin{pmatrix} 1 & z \\ y & 1+zy \end{pmatrix}, \quad (10)$$

Only the value of the impedance standard z should be known within the equations (8)–(10). What is referred to as the self-calibration now has the job of producing the size of the admittance y and the product of the complex propagation constant γ with the mechanical length l. For practical reasons, the selection of the values for the ZY standard will be selected such that this is matched to 50 Ω from one side. Further, the rotated ZY standard will be employed as YZ standard. First, the matrix $[B]^{-1}$ in the equation (6) should be eliminated with equation (7).

$$[Myz][Mzy]^{-1}=[A][Kyz][Kzy]^{-1}[A]^{-1} \quad (11)$$

One has thus arrived at a linear imaging of the parameters of the calibration objects and the measured values appertaining thereto that are referred to as similarity transformation. Upon utilization of the trace equivalency, a calculation equation for the unknown admittance y can be derived:

$$y = \pm \frac{\sqrt{\beta_1 - 2}}{z}, \quad (12)$$

with the quantity $\beta_1$ deriving from the measured values.

$$\beta_1 = \text{trace}\,([Myz][Mzy]^{-1}) \quad (13)$$

When the matrix $[B]^{-1}$ of equation (5) is eliminated with equation (6), then one arrives at equation (14).

$$[Ml][Mzy]^{-1}=[A][Kl][Kzy]^{-1}[A]^{-1} \quad (14)$$

Equation (15) follows from the trace equivalency.

$$\frac{\text{trace}\,([Ml][Mzy]^{-1})}{\beta_2} = \quad (15)$$

$$\underbrace{\frac{\frac{1}{2}(2+zy-z-y)e^{\gamma l}}{=\alpha_1}} + \underbrace{\frac{\frac{1}{2}(2+zy+z+y)e^{-\gamma l}}{=\alpha_2}}$$

The evaluation of this equation yields the sought product γl.

$$\gamma l = \ln\left(\frac{\beta_2}{2\alpha_1} \pm \sqrt{\left(\frac{\beta_2}{2\alpha_1}\right)^2 - \frac{\alpha_2}{\alpha_1}}\right) \quad (16)$$

The uncertainty of operational sign must be solved, as in other calibration methods as well, via prior information of the electrical length of ±90°.

The following properties are what distinguish this simple self-calibration method from the calibration method LRM currently employed:

In the LRM method, the line must be completely known; by contrast, only a matched line need be utilized in the LZY method.

The known reference impedance in the LRM method lies to ground; in the LZY method, by contrast, this lies planarly in series, this benefitting a precise manufacturability.

Since the Z standard can be more easily manufactured than the M standard, this ZY standard can also be realized well up to higher frequencies.

The two calibration standards of the LZY method require less space than the standards of the LRM method, this being extremely important particularly in the manufacture on expensive semiconductor substrates.

It is thus obvious that the LZY method not only represents a good alternative to the LRM method for on-wafer measurements but can also be viewed as the next step in the field of self-calibration methods for on-wafer measurements in the case free of crosstalk.

The LZN Method

Figure 3:
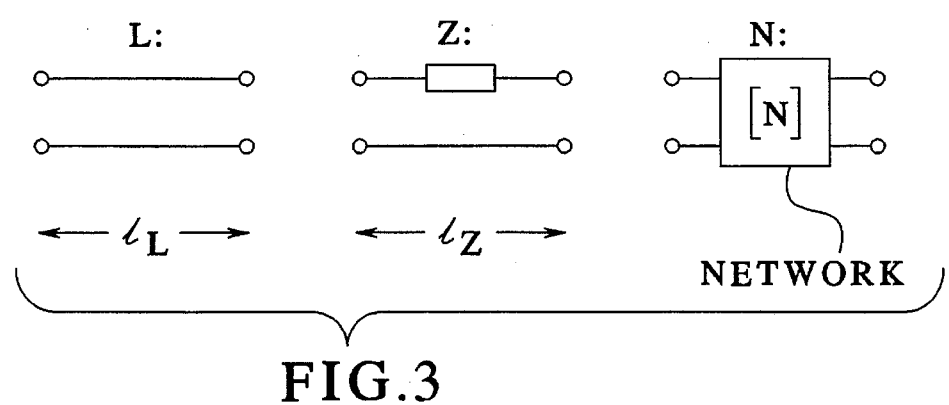

The calibration standards of the inventive LZN method are shown in FIG. 3. As usual, the calibration line must have matching. The propagation constant γ, however, need not be known. The impedance value of the Z-standard represents the reference impedance. Only reflection symmetry is required of the N-standard.

First, we shall turn to the calculation of the propagation constant only with the standards L and Z. With reference to equation (3) these standards derive in transmission parameters:

$$L:[Ml]=[A][Nl][B]^{-1} \quad (17)$$

$$Z:[Mz]=[A][Nz][B]^{-1} \quad (18)$$

with the transmission parameter matrices $$[Nl] = \begin{pmatrix} e^{\gamma l} & 0 \\ 0 & e^{-\gamma l} \end{pmatrix}, \quad (19)$$

$$[Nz] = \frac{1}{2} \begin{pmatrix} 2-z & z \\ -z & 2+z \end{pmatrix}, \quad (20)$$

The length l derives from the difference length between the physical expanse of the L-standard and of the Z-standard (FIG. 3).

$$l = l_L - l_z \quad (21)$$

When the matrix $[B]^{-1}$ in the equations (17) and (18) is again eliminated, then a simple self-calibration equation is acquired anew via the trace equivalency for calculating the product of propagation constant and difference length ($\gamma l$). This equation (22) only contains the impedance value z normed to the reference impedance in addition to containing the measured values.

$$\gamma l = \ln(\alpha_1 \pm \sqrt{(\alpha_1)^2 - \alpha_2}) \quad (22)$$

Equation (22) contains the following abbreviations:

$$\alpha_1 = \frac{\beta_1}{2-z}, \quad (23)$$

$$\alpha_2 = \frac{2+z}{2-z}, \quad (24)$$

$$\beta_1 = \text{trace} ([Mz][Ml]^{-1}). \quad (25)$$

It can be seen that an impedance z must be unequal to double the value of the reference impedance; otherwise, these equations become singular. The uncertainty of operational sign and the further conditions with respect to the L-standard behave as in the LZY method.

The third calibration standard N should comprise the three unknown scatter parameter quantities $Sn_{11}$, $Sn_{12}$ and $Sn_{21}$. So that this reflection-symmetrical standard can also be composed of the one-port standards that are important in practice, a transition to what is referred to as the psuedo-transmission parameters is necessary.

The measured value matrix of equation (4) is as follows for this transmission:

$$[Mn] = \frac{1}{m_3' m_4'' - m_3'' m_4'} \begin{pmatrix} m_1' & m_1'' \\ m_2' & m_2'' \end{pmatrix} \begin{pmatrix} m_3' & m_3'' \\ m_4' & m_4'' \end{pmatrix}^T = \quad (26)$$

$$\frac{1}{m_{nx}} = [Mn']$$

This step is necessary since $m_{nx}$ becomes zero given a double one-port calibration standard. When this measured value determinant is assigned to the physical parameters of the N-standard, then equation (3) can be formulated for the third standard:

$$[Mn'] = [A] \frac{m_{nx}[Nn]}{=[Nn']} [B]^{-1} \quad (27)$$

The quantities of the network [Nn'] have the following relationship with the scatter parameters.

$$[Nn'] \frac{1}{T} \begin{pmatrix} -r^2 + tT & r \\ -r & 1 \end{pmatrix} \quad (28)$$

$$t = Sn_{12} \cdot m_{nx} \quad (29)$$

$$T = Sn_{21}/m_{nx} \quad (30)$$

$$r = Sn_{11} = Sn_{22} \quad (31)$$

When equation (27) is then operated with equations (17) and (18), four non-linear equations result via the similarity transformation. These equations are required for the calculation of the three sought parameters and the abbreviations $\beta_i$ of the measured value equations are derivable from their structure.

$$T^2 \beta_4 = e^{\gamma l}(tT - r^2) + e^{\gamma l} \quad (32)$$

$$T\beta_4 = t \quad (33)$$

$$2T\beta_5 = \alpha_3(tT - r^2) - 2zr + \alpha_4 \quad (34)$$

$$2T\beta_7 = (2+z)(tT - r^2) + 2zr + 2 - z \quad (35)$$

$$\alpha_3 = e^{2\gamma l}(2-z) \quad (36)$$

$$\alpha_4 = e^{-\gamma l}(2+z) \quad (37)$$

$$\beta_3 = \text{trace} ([Mn'][Ml]^{-1}) \quad (38)$$

$$\beta_4 = \det ([Mn'][Ml]^{-1}) \quad (39)$$

$$\beta_5 = \text{spur} ([Mn'][Ml]^{-1}[Mz'][Ml]^{-1} \quad (40)$$

$$\beta_6 = \text{spur} ([Mn'][Mz]^{-1}) \quad (41)$$

After a short intermediate calculation, the sought quantities of the N-network are obtained.

$$r = \frac{\alpha_8}{2\alpha_7} \pm \sqrt{\left(\frac{\alpha_8}{2\alpha_7}\right)^2 - \frac{\alpha_9}{\alpha_7}} \quad (42)$$

$$T = \frac{\alpha_6}{\alpha_5} - 2\frac{z}{\alpha_5} r \quad (43)$$

$$t = T\beta_4 \quad (44)$$

$$\alpha_5 = e^{-\gamma l}(2+z)\beta_3 - 2\beta_6 \quad (45)$$

$$\alpha_6 = e^{-2\gamma l}(2+z) - 2 + z \quad (46)$$

$$\alpha_7 = \beta_4 \left(\frac{\alpha_6}{\alpha_5}\right)^2 2\frac{z}{a_5}\beta_4 - 1 \quad (47)$$

$$\alpha_8 = 2\beta_4 \frac{\alpha_6}{\alpha_5} \frac{2z}{\alpha_5} - e^{-\gamma l}\frac{2z}{a_5}\beta_3 \quad (48)$$

$$\alpha_9 = e^{-2\gamma l} - e^{-\gamma l}\beta_3 \frac{\alpha_6}{\alpha_5} \quad (49)$$

Accordingly, the LZN method contains three unknown quantities in the N-standard that can be utilized for self-monitoring of an ensued systematic error calibration. By contrast to the LRM method, transmission values are additionally available here as self-calibration quantities.

The LZZY Method

The fact that the series impedance must still be completely known in the LZN method can definitely lead to problems. The LZZN method alleviates this problem. Two different series impedances are required for the implementation of this method.

Only the real part should be respectively known of these two impedances. The imaginary parts are then the sought quantities of a further self-calibration step. One equation (22) is used for both impedances and, upon elimination of $e^{\gamma l}$, these two equations are equated. This results in a complex non-linear equation available for calculating the two imaginary parts. Consequently, this equation can only be numerically evaluated.

The LMS Method

The LMS method is closely related to the LRM method. These two methods differ in that the line may comprise an unknown propagation constant in the LMS method and, by contrast to the LRM method, the reflection standard must be known. Just like the LRM method, the LMS method comprises only one unknown self-calibration quantity. The calculation of this unknown transmission value of the line can ensue, among other things, in that the uniform 8*8 equation system for calculating the error coefficients is composed of the four equations for the line standard and the respectively two equations for the reflection standards. The equation system is manipulated by numerical variation of the self-calibration quantity such that the determinant value thereof yields the value zero necessary for uniform equation systems.

The seven error terms can be subsequently defined in a traditional way with the non-uniform 7*7 equation system.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for calibrating a network analyzer having two test ports and at least four measuring locations, in which measurements of the transmission and reflection parameters at three calibration standards are performed successively, the three calibration standards being successively connected in arbitrary sequence between the two test ports, according to a seven-term principle, comprising the steps of:

providing an electrical line whose characteristic impedance is known and whose electrical propagation constant is unknown and complex;

using in a first calibration measurement said electrical line to provide first measured value;

using in second and third calibration measurements, respectively, at least one two-port connected between the two test ports, the two-port being formed by concentrated components, to provide second and third measured values, respectively; and calculating the electrical propagation constant of said electrical line from said first, second and third measured values;

wherein correction values that are taken into consideration in following object measurements are calculated from said first, second and third measured values.

2. The method according to claim 1, wherein said electrical line is a line constructed in planar stripline technology.

3. The method according to claim 1, wherein said two-port that is used for the second calibration measurement is composed of a series-connected component with known impedance and a concentrated component of unknown impedance connected to ground, and wherein the third calibration measurement is implemented at this same two-port of the second calibration measurement that is turned with respect to terminals at the two test ports.

4. The method according to claim 1, wherein said second calibration measurement is implemented at a first two-port that is composed only of a single, concentrated, series-connected component with known impedance; and wherein said third calibration measurement is implemented at a reflection-symmetrical second two-port whose impedance is unknown.

5. The method according to claim 4, wherein the second calibration measurement is implemented at said first two-port, for which only the resistance of the series-connected component is known and the reactance is unknown; wherein the method further comprises, preceding the third calibration measurement, a further calibration measurement at a third two-port that is composed only of a single, concentrated, series-connected component with known resistance but with unknown reactance and whose value of resistance differs from a value of resistance of said two-port of the second calibration measurement.

6. The method according to claim 1, wherein the second calibration measurement is implemented with a first one-port whose characteristic impedance is known and that is successively connected to each of the two test ports; and wherein the third calibration measurement is implemented with a second one-port that has known reflection and is successively connected to the two test ports.

7. A method for calibrating a network analyzer having two test ports and at least four measuring locations, in which measurements of the transmission and reflection parameters at three calibration standards are performed successively, the three calibration standards being successively connected in arbitrary sequence between the two test ports, according to a seven-term principle, comprising the steps of:

providing an electrical line whose characteristic impedance is known and whose electrical propagation constant is unknown and complex;

using in a first calibration measurement said electrical line to provide first measured value;

using in a second calibration measurement a first one-port whose characteristic impedance is known and that is successively connected to each of the two test ports to provide second measured values;

using in a third calibration measurement a second one-port that has known reflection and that is successively connected to the two test ports to provide third measurement values; and calculating the electrical propagation constant of said electrical line from said first, second and third measured values;

wherein correction values that are taken into consideration in following object measurements are calculated from said first, second and third measured values.

8. The method according to claim 7, wherein said electrical line is a line constructed in planar stripline technology.

9. A method for calibrating a network analyzer having two test ports and at least four measuring locations, in which measurements of the transmission and reflection parameters at three calibration standards are performed successively, the three calibration standards being successively connected in arbitrary sequence between the two test ports, according to a seven-term principle, comprising the steps of:

providing an electrical line whose characteristic impedance is known and whose electrical propagation constant is unknown and complex;

using in a first calibration measurement said electrical line to provide first measured value;

using in a second calibration measurement a first two-port connected between the two test ports, the first two-port being formed by a single, concentrated, series-connected component for which only the resistance of the series-connected component is known and the reactance is unknown;

using in a third calibration measurement a second two-port connected between the two test ports, the second two-port being composed of only a single, concentrated, series-connected component with known resistance but with unknown reactance and whose value of resistance differs from a value of resistance of said two-port of the second calibration measurement; and using in a fourth calibration measurement a reflection-symmetrical second two-port whose impedance is unknown, connected to the two test ports to provide fourth measured values;

calculating the electrical propagation constant of said electrical line from said first, second, third and fourth measured values;

wherein correction values that are taken into consideration in following object measurements are calculated from said first, second and third measured values.

10. The method according to claim 9, wherein said electrical line is a line constructed in planar stripline technology.

* * * * *

UNITED STATES PATENT AND TRADEMARK OFFICE
CERTIFICATE OF CORRECTION

PATENT NO. : 5,608,330
DATED : March 4, 1997
INVENTOR(S) : Holger Heuermann and Burkhard Schiek It is certified that error appears in the above-identified patent and that said Letters Patent is hereby corrected as shown below:

Title page,
Item [73], Assignee should indicate Rhode & Schwarz GmbH & Co. KG, Munich, Germany and Rosenberger Hochfrequenztechnik GmbH & Co., Tittmoning, Germany Signed and Sealed this Fifth Day of March, 2002

Attest:

JAMES E. ROGAN
Attesting Officer   Director of the United States Patent and Trademark Office